(12) United States Patent
Stroessner (10) Patent No.: US 9,116,447 B2
(45) Date of Patent: Aug. 25, 2015

(54) MICROSCOPE FOR RETICLE INSPECTION WITH VARIABLE ILLUMINATION SETTINGS

(75) Inventor: Ulrich Stroessner, Jena (DE)

(73) Assignee: Carl Zeiss SMS GmbH, Jena (DE)

( * ) Notice: Subject to any disclaimer, the term of this patent is extended or adjusted under 35 U.S.C. 154(b) by 695 days.

(21) Appl. No.: 13/063,294

(22) PCT Filed: Sep. 18, 2009

(86) PCT No.: PCT/EP2009/006753
§ 371 (c)(1),
(2), (4) Date: Mar. 10, 2011

(87) PCT Pub. No.: WO2010/034433
PCT Pub. Date: Apr. 1, 2010

(65) Prior Publication Data
US 2011/0164313 A1    Jul. 7, 2011

Related U.S. Application Data

(60) Provisional application No. 60/101,732, filed on Oct. 1, 2008.

(30) Foreign Application Priority Data

Sep. 26, 2008    (DE) .......................... 10 2008 049 365

(51) Int. Cl.
G02B 21/06    (2006.01)
G03F 1/84    (2012.01)
(Continued)

(52) U.S. Cl.
CPC .............. G03F 1/84 (2013.01); G02B 21/0016 (2013.01); G02B 21/16 (2013.01)

(58) Field of Classification Search
CPC .... G02B 21/06; G02B 21/16; G02B 21/0092; G02B 21/14
USPC ...................... 359/364–366, 386; 355/52–56; 356/399–401
See application file for complete search history.

(56) References Cited

U.S. PATENT DOCUMENTS 6,690,469 B1    2/2004   Shibata et al.
6,791,766 B2 *  9/2004   Nishikawa ................... 359/811
(Continued)

FOREIGN PATENT DOCUMENTS

DE         103 52 040           7/2005
DE     10 2005 049 572          4/2007
(Continued)

OTHER PUBLICATIONS

"Functional Inspection of Photomasks", IBM Technical Disclosure Bulletin, US, vol. 36, No. 5, May 1, 1993, p. 265.
(Continued)

Primary Examiner — Scott J Sugarman
Assistant Examiner — Tamara Y Washington
(74) Attorney, Agent, or Firm — Fish & Richardson P.C.

(57) ABSTRACT

A mask inspection microscope for variably setting the illumination. It serves for generating an image of the structure of a reticle arranged in an object plane in a field plane of the mask inspection microscope. It comprises a light source that emits projection light, at least one illumination beam path, and a first diaphragm for generating a resultant intensity distribution of the projection light in a pupil plane of the illumination beam path, that is optically conjugate with respect to the object plane. The mask inspection microscope has at least one further diaphragm for generating the resultant intensity distribution. The first diaphragm and the at least one further diaphragm influence the resultant intensity distribution of the projection light at least partly at different locations of the pupil plane.

22 Claims, 5 Drawing Sheets

(51) Int. Cl.
*G02B 21/00* (2006.01)
*G02B 21/16* (2006.01)

(56) References Cited

U.S. PATENT DOCUMENTS

| | | | |
|---|---|---|---|
| 6,885,433 B2 * | 4/2005 | Shiraishi | 355/67 |
| 7,310,131 B2 * | 12/2007 | Jasper | 355/71 |
| 8,305,552 B2 * | 11/2012 | Nishinaga et al. | 355/53 |
| 2001/0046038 A1 | 11/2001 | Mulkens et al. | |
| 2002/0186879 A1 | 12/2002 | Hemar et al. | |
| 2005/0168809 A1 | 8/2005 | Moller et al. | |
| 2006/0023193 A1 | 2/2006 | Schuster et al. | |
| 2006/0291031 A1 | 12/2006 | Boehm et al. | |
| 2008/0278790 A1 | 11/2008 | Boesser et al. | |

FOREIGN PATENT DOCUMENTS

| | | |
|---|---|---|
| DE | 10 2007 021 823 | 11/2008 |
| EP | 0 628 806 | 12/1994 |
| EP | 1 008 884 | 6/2000 |
| WO | WO2008/071294 | 6/2008 |

OTHER PUBLICATIONS

German Office Action for German Application No. 10 2008 049 365.1 dated May 15, 2015 (8 pages).

* cited by examiner

MICROSCOPE FOR RETICLE INSPECTION WITH VARIABLE ILLUMINATION SETTINGS

This application is the National Stage of International Application No. PCT/EP 2009/006753, filed Sep. 18, 2009, which claims priority to German Application No. 10 2008 049 365.1, filed Sep. 26, 2008 and to U.S. Provisional Patent Application Ser. No. 61/101,732, filed on Oct. 1, 2008. The contents of the above applications are incorporated by reference in their entireties.

The invention relates to a mask inspection microscope for generating an image of the structure of a reticle arranged in an object plane in a field plane of the mask inspection microscope, comprising a light source that emits projection light, at least one illumination beam path, and a first diaphragm for generating a resultant intensity distribution of the projection light in a pupil plane of the illumination beam path that is optically conjugate with respect to the object plane.

In lithography for producing semiconductor components, the structures of reticles (which are also referred to synonymously as mask) are projected onto wafers coated with a light-sensitive layer, the resist. In the case of mask inspection microscopes, the structure of a reticle is projected onto a light-sensitive spatially resolved detector such as, for example, a CCD chip (charge coupled device). During projection onto the wafer, the structure is imaged in demagnified fashion; in current apparatuses, the structure is demagnified by a factor of four. During projection onto the spatially resolved detector, the structure is magnified by a factor of 150, for example, in order more accurately to identify structure defects possibly present.

Since, during mask inspection, defects which also occur during wafer exposure are predominantly of interest, the aerial images generated in the resist and on the detector have to be as far as possible identical, apart from the magnification. In order to achieve an equivalent image generation, during mask inspection the illumination and, on the object side, the numerical aperture are adapted to the scanner used.

A further form of mask inspection microscopes serves for measuring the reticles and is also referred to as a registration tool. The positions of special markers ("registration pattern") or of features of the structure of the reticle, such as e.g. the position of specific edges, are determined. The illumination is used by the stated conventional and abaxial illumination settings for optimizing the contrast. The accuracy of the registration measurement is thus increased.

Mask inspection microscopes can operate in transmission or in reflection. The image of the reticle arises either after transmission of the projection light through the mask or after reflection of the projection light at the surface of the mask. Both possibilities can also be combined.

The illumination is optimized in scanners for wafer exposure in accordance with the structures of the reticles that are to be imaged in each case. Conventional illumination settings having different degrees of coherence and abaxial illumination settings such as, for example, annular illumination and dipole or quadripole illumination are customary. These illumination settings describe the intensity distribution of the illumination in a pupil plane of the mask inspection microscope. The depth of focus and/or the resolving power are increased by illumination settings for generating an abaxial, oblique illumination.

In scanners, the degree of coherence of the illumination is set by means of zoom lenses. Annular illumination is achieved by means of rotationally symmetrical axicons; multipolar such as e.g. quadripolar illumination is achieved for example by means of pyramidal axicons. By means of displacing the axicons, the illumination setting can be varied within wide ranges. In the case of annular illumination, the inner coherence of the projection light is thus determined. In the case of zoom axicons, the outer coherence is defined at the same time. Any further illumination settings can be generated by means of special diffractive optical elements that are used by themselves or in conjunction with axicons and/or zoom lenses.

Optical units having a smaller image field than in the case of scanners are used in the case of mask inspection microscopes for cost reasons. Considerably smaller axicons than in the case of scanners would thus be required here, the production of which is very complicated. Since the requirements made of the illumination intensity are lower in the case of mask inspection microscopes, the use of axicons or diffractive optical elements is not necessary here, however. The illumination settings are realized by means of simple diaphragms. One diaphragm is then required for each illumination setting. These diaphragms determine the intensity distribution of the illumination in a pupil plane of the mask inspection microscope by means of light-transmissive and light-opaque regions. The diaphragms are produced in chromium on glass, for example, in the case of illumination with projection light having a wavelength in the DUV range. They can also be produced from sheet metal having corresponding openings at light-transmissive locations. The magnitude of the intensity distribution generated by a diaphragm is varied by the combination with zoom lenses.

In order to meet the ever higher requirements made of the imaging capacities of scanners, ever more sophisticated illumination settings are used in lithography. Thus e.g. aqua (a combination of low-sigma annular and quasar), quasars that do not have 90° symmetry, etc. Moreover, in the case of the scanner, illumination settings are preferred for which the intensity distribution in the pupil plane does not have a so-called "top hat" profile, but rather e.g. a continuous profile. In the case of "top hat" profile, the gradient between dark and bright regions is very steep. The gradient is smaller for example in the case of the annular illumination that can be achieved by means of axicons. These smaller gradients can be realized only poorly by means of the above-mentioned diaphragms known in mask inspection, since the transmission of the diaphragms would have to be finely varied here. This is evidently not possible in this way in the case of perforated diaphragms. However, in the case of e.g. abovementioned diaphragms composed of chromium and glass, too, it is virtually impossible to realize partly transparent regions of the required size.

This means that numerous different illumination settings have to be made possible for adapting the illumination settings to the scanner for mask inspection microscopes. As soon as new illumination settings are found for the scanner, they also have to be made possible for mask inspection microscopes.

The object of the invention, therefore, is to provide a mask inspection microscope which makes it possible to set numerous different illumination settings in a simple and cost-effective manner.

According to the invention, this object is achieved by means of a mask inspection microscope which has at least one further diaphragm for generating the resultant intensity distribution, wherein the first diaphragm and the at least one further diaphragm influence the resultant intensity distribution of the projection light at least partly at different locations of the pupil plane that is optically conjugate with respect to the object plane.

The resultant intensity distribution of the projection light of the pupil plane that is optically conjugate with respect to the object plane can be for example the intensity distribution of a real pupil plane that lies for example in a condenser of an illumination beam path. If the intensity distributions of the different diaphragms are combined only in the object plane, the intensity distribution of the virtual pupil plane should be understood here.

The resultant intensity distribution of the projection light of the pupil plane that is optically conjugate with respect to the object plane is influenced by a plurality of diaphragms. The resultant intensity distribution of the projection light of the pupil plane that is optically conjugate with respect to the object plane is also referred to hereinafter for short as "resultant intensity distribution".

The arrangement of the diaphragms is variable. It is possible for example sequentially along the at least one illumination beam path. The diaphragms can be arranged within an illumination beam path for example directly one behind another or in a manner spaced apart from one another.

In the case of a plurality of illumination beam paths, different diaphragms can also be arranged in the different illumination beam paths, which are arranged parallel for example. The intensity distribution relevant to the illumination is then the pupil plane that results from superposition of the intensity distributions of the parallel pupil planes and is optically conjugate with respect to the object plane.

The sequential arrangement of diaphragms along an illumination beam path and that in parallel observation beam paths can be combined as desired.

The generation of the intensity distribution of the pupil plane that is optically conjugate with respect to the object plane by means of a plurality of different diaphragms makes it possible to achieve, on the one hand, illumination settings which would not be possible with only one diaphragm, for example as a result of the superposition of pupil planes having different intensity distributions of the projection light. On the other hand, the provision of a set of individual diaphragms in conjunction with the use of a plurality of diaphragms leads to a multiplicity of combination possibilities, whereby the number of possible different illumination settings becomes greater than the number of diaphragms present.

The projection light used here can be any form of electromagnetic radiation, thus for example laser radiation from excimer lasers in the DUV range having a wavelength of 365 nm, 248 nm, 193 nm, 153 nm or 13 nm.

A detector for recording the aerial image is preferably arranged in a field plane of the mask inspection microscope, onto which field plane the reticle in the object plane is ultimately imaged. The data can thus be processed further by a data processing system that is furthermore provided.

The structure presented on a reticle is imaged. In the case of simple masks, said structure can be defined by the chromium layer situated on the glass. The structure presented is also imaged in the case of the different types of phase shift masks such as, for example, alternating phase shift masks or attenuated phase shift masks.

In a further configuration of the invention, at least two diaphragms used as first diaphragm or as further diaphragm are arranged on a diaphragm plate, such that the individual diaphragms are changed by the movement of the diaphragm plate.

The diaphragm plate can be arranged at the desired position in the illumination beam path by means of a mount in such a way that a desired diaphragm can be introduced into the illumination beam path by means of displacing the diaphragm plate. This displacement can be effected by means of a drive, such as, for example, a piezo-element or an electric motor. Different diaphragm plates can also be provided, such that a multiplicity of further diaphragms are available simply by exchanging the diaphragm plate.

The mount of the diaphragm plate is configured in such a way that exchange is possible in a simple manner, but the position of the diaphragm plate relative to the mount is defined with high accuracy. The reproducibility of the positioning in the illumination beam path has to be very high in the case of repeated installation and demounting.

With the use of a plurality of diaphragm plates that are arranged simultaneously in one and/or a plurality of illumination beam paths, by combining the respective diaphragms of the different diaphragm plates the number of combination possibilities is even higher.

This measure has the advantage that a multiplicity of different diaphragms which can be exchanged in a rapid and simple manner are available in a simple manner.

In a further configuration of the invention, a data record having information about positions of the diaphragms on the diaphragm plate is present with respect to each diaphragm plate.

This measure permits the automatic positioning of a diaphragm of a diaphragm plate and the selection of the diaphragm having specific properties e.g. according to the choice of the user or by means of an algorithm of a data processing system.

The position of a diaphragm is specified for example as coordinates of the midpoint of the diaphragm proceeding from a reference point on the diaphragm plate.

In a further configuration of the invention, a data record having information about properties of the diaphragms is present with respect to each diaphragm plate.

By way of example, the outer and inner degrees of coherence or the aperture angles or positions and diameters of poles are specified as properties of the diaphragms. It is also possible to specify the complete form or a graphical representation of the diaphragms.

In a further configuration of the invention, a data processing system is provided, which determines possible illumination settings with respect to predetermined diaphragm plates.

By combining the diaphragms present, numerous illumination settings are now possible according to the invention. For the user it is now difficult, given this multiplicity of combination possibilities, to select the appropriate one in each case. If data concerning the properties of the diaphragms and concerning the illumination settings that can be achieved by means of corresponding combination possibilities are stored in the data processing system, all the combination possibilities can be determined. The user can then select the desired illumination setting from the possibilities determined.

The data processing system can also take account of the different combination possibilities of the diaphragms in conjunction with the sequential or parallel arrangement of the diaphragms or the possibility of the zoom of intensity distributions of individual pupil planes.

In a further configuration of the invention, at least one polarizer is arranged in the at least one illumination beam path.

Polarizer should be understood here to mean any type of polarization-influencing optical elements.

This measure has the advantage that the projection light, during mask inspection, can be adapted even more precisely to the conditions of the scanner. Polarized illumination is advantageous in the case of high-aperture scanners, in particular. By way of example, linearly, radially or tangentially polarized light can be used here.

In a further configuration of the invention, at least one of the polarizers linearly polarizes the projection light.

Linear polarization can be achieved in a simple manner in respect of apparatus, for example by means of polarizing beam splitters. In the case of illumination settings e.g. in the form of dipoles or disars, linear polarization comes close to the preferred tangential illumination.

In a further configuration of the invention, at least one of the polarizers polarizes the projection light at least in sections tangentially with respect to the optical axis of the illumination beam path.

As already mentioned, during mask inspection one frequent task is to simulate the tangential polarization of the projection light of the scanners. In the case of annular illumination setting or quasars having large aperture angles or in the case of quadrupoles or quasars, the use of linearly polarized light is not sufficient. Tangentially polarized projection light can be provided here. This can be effected for example by rotation in sections of the direction of linearly polarized light by means of a further polarizer, which is also referred to as a polarization converter. By way of example, a subdivision into 4, 8 or 12 sections can be effected in this case. It is also possible, as usual in the case of scanners, to provide a continuous tangential polarization.

In a further configuration of the invention, at least two diaphragms are arranged along an illumination beam path.

In the case of this sequential arrangement of the diaphragms, the projection light impinges successively on at least partly different diaphragms. Each diaphragm can thus contribute to reducing the intensity distribution at least partly different locations of the pupil plane that is optically conjugate with respect to the object plane.

This measure has the advantage that a multiplicity of illumination settings can be made possible in a simple manner even in the case of simple configuration of a mask inspection microscope with only one illumination beam path.

In a further configuration of the invention, at least two diaphragms are arranged in different pupil planes.

In the case of this configuration, the intensity distribution of one pupil plane is imaged onto at least one other pupil plane. If a diaphragm is again situated in the latter, the intensity distribution is influenced further by said diaphragm. The number of illumination settings can be increased further in particular by altering the magnitude of the intensity granting during the imaging, by means of a zoom optical unit.

This measure has the advantage that all the diaphragms can be situated exactly in a pupil plane and can thus be imaged sharply onto one another.

In a further configuration of the invention, at least two diaphragms are arranged jointly in one of the pupil planes.

The diagraphms arranged jointly in a pupil plane act to a good approximation like a common diaphragm.

If a sharp imaging is desired, the two diaphragms can be arranged along the observation beam path so close together that both lie in the region of the depth of focus of the respective pupil plane. A typical distance is 2 mm, possibly even less than that.

This measure has the advantage that the illumination beam path can be made short and thus configured in a space-saving manner.

In a further configuration of the invention, at least one first set of the diaphragms is configured in such a way that the radius-dependent intensity distribution of the projection light and at least one second set of the diaphragms is configured in such a way that the angle-dependent intensity distribution of the projection light is determined.

The radius-dependent diaphragms typically define the outer and the inner coherence of the illumination light, those parameters that define the annular illumination often encountered in lithography. By means of the angle-dependent diaphragms, for example, the number and the extent of the poles in the case of multipolar illumination, such as e.g. disars or quasars. A limiting case is the conventional illumination with an inner coherence of 0, that is to say a disk-shaped, i.e. circular, intensity distribution.

This measure has the advantage that adaptation to illumination settings that are typical in lithography is simplified.

In particular a combination with the diaphragm plates in accordance with a configuration of the invention described above is furthermore advantageous, wherein each of the sets of diaphragms is arranged on a diaphragm plate. The desired combinations of the diaphragms are thus rapidly accessible.

In a further configuration of the invention, the at least one illumination beam path, for splitting the projection light, is split at least in sections into at least two illumination beam paths and at least one diaphragm is arranged in each of the illumination beam paths.

The projection light can be split by means of simple beam splitters. Polarization-independent beam splitters are preferably used. An advantageous compromise between apparatus outlay and resulting advantages is to provide two illumination beam paths.

The diaphragms are arranged parallel here in such a way that each of the at least one diaphragm arranged in each of the illumination beam paths, at different locations of the pupil plane that is optically conjugate with respect to the object plane, can contribute to increasing the intensity distribution. In the case of diaphragms having regions having identical transmission, the magnitude of the intensity can be varied by the superposition of intensities.

Thus, with individual diaphragms, with a tenable outlay during production, it is possible to realize only so-called "top hat" profiles with an almost abrupt change in the intensity distribution. Softer transitions in the resultant intensity distribution of the pupil plane can be achieved by the superposition of two or more intensity distributions having slightly different magnitudes.

In a further configuration of the invention, the illumination beam paths are recombined upstream of the object plane.

This combining is preferably effected by means of a polarization-independent beam splitter. This is advantageous particularly when a specific polarization of the projection light was achieved within the illumination beam paths.

Polarizing beam splitters, for example beam splitters that are linearly polarizing in the X, Y direction, can be used both for splitting the polarization light and for combining. The polarization obtained in the individual illumination beam paths can then be utilized in a targeted manner for illumination settings. When the illumination beam paths are combined, the respective projection light of individual illumination beam paths can be fully utilized by means of polarizing beam splitters used in a targeted manner.

Polarizers can be arranged in one or in each of the illumination beam paths or downstream of a combining of the illumination beam paths.

This measure has the advantage that the intensity distribution of the projection light in the pupil plane can be varied in a targeted manner by the superposition of individual intensity distributions of the pupil planes of the further illumination beam paths.

In a further configuration of the invention, polarization converters for the elimination of undesired polarization of the projection light are arranged in at least one of the illumination beam paths.

The splitting and combining of the projection light by beam splitters can also result in the occurrence of undesired polarizations of the projection light. By means of the arrangement of polarization converters, the undesired polarizations can be rotated with respect to one another in such a way that they are eliminated. $\lambda/2$ plates are preferably used here.

In a further configuration of the invention, at least two of the diaphragms influence the intensity distribution of the pupil plane at different locations.

This measure affords a further possibility of obtaining further illumination settings by combination of diaphragms. Thus, by way of example, the combination of two dipoles rotated by 90° in the pupil plane can result in a quadripolar intensity distribution.

In a further configuration of the invention, at least one polarizer is arranged in each of the illumination beam paths.

This measure affords a possibility of combining or superposing polarized projection light. Thus, the above-described configurations of the polarizers can be arranged in each of the illumination beam paths. Thus, there is the possibility of providing projection light having different polarization directions in different regions of the pupil plane. If there were for example two dipoles rotated by 90° in each of the observation beam paths, given corresponding arrangement of polarizers for generating linearly polarized light in each of the observation beam paths, a quadripolar intensity distribution having to a good approximation tangential polarization can be achieved as a result.

In a further configuration of the invention, the projection light is split between the illumination beam paths to the extent of identical portions in each case.

This splitting can be effected by simple beam splitters. Given two illumination beam paths, the light is distributed uniformly between both illumination beam paths.

In a further configuration of the invention, an attenuator is arranged in at least one of the illumination beam paths.

This makes it possible to vary the intensity distribution further. Thus, the proportion made up by the intensity distributions of the individual illumination beam paths in the resultant intensity distribution of the projection light of the pupil plane that is optically conjugate with respect to the object plane can be weighted differently. Preferably, in two illumination beam paths, an attenuator is arranged in each of them.

Plates whose transmissivity for the respective projection light increases along the direction of movement are used as attenuators. Thus, the radiation is attenuated to a greater extent, the greater the extent to which the attenuator is introduced into the illumination beam path.

In a further configuration of the invention, a shutter is arranged in at least one of the illumination beam paths.

This arrangement makes it possible to eliminate the contribution from illumination beam paths that is not required for specific illumination settings by closing the respective shutters.

Generally, diaphragms introduced into the illumination beam path have to be centered, that is to say oriented with respect to the optical axis. In this case, e.g. the intensity distribution of the pupil plane that is generated by the diaphragm is imaged by a Bertrand lens on the detector of the mask inspection microscope. The diaphragm is then adjusted until this image has the desired position. It is advantageous here to center each of the diaphragms individually. If there is a shutter in each of the illumination beam paths, the illumination beam path containing the respective diaphragm to be centered can be opened and the shutters of the remaining illumination beam paths can be closed.

In a further configuration of the invention, at least one zoom lens is arranged in the at least one illumination beam path, a pupil plane of the at least one illumination beam path being imaged in variable size onto at least one further pupil plane of the illumination beam path by means of said at least one zoom lens.

This measure enables the illumination settings to be varied even more finely. Thus, the intensity distribution generated by one diaphragm in one pupil plane with variable magnitude can be combined with the intensity distribution generated by another diaphragm in another pupil plane.

This is advantageous both in the case of the sequential and in the case of the parallel arrangement of diaphragms.

In the case of the sequential arrangement of diaphragms, the values for the outer and inner coherence can be varied e.g. by means of an annular diaphragm.

Given for example two identical diaphragms arranged sequentially, soft gradients of the profile of the resultant intensity distribution can be realized by superposition of two images of the pupil that differ slightly in size.

It goes without saying that the features of the invention mentioned above and those yet to be explained below can be used not only in the described combinations but also in further combinations or individually, without departing from the scope of the present invention.

The invention is described and explained in greater detail below on the basis of some selected exemplary embodiments and with reference to the drawings, in which.

Figure 1:
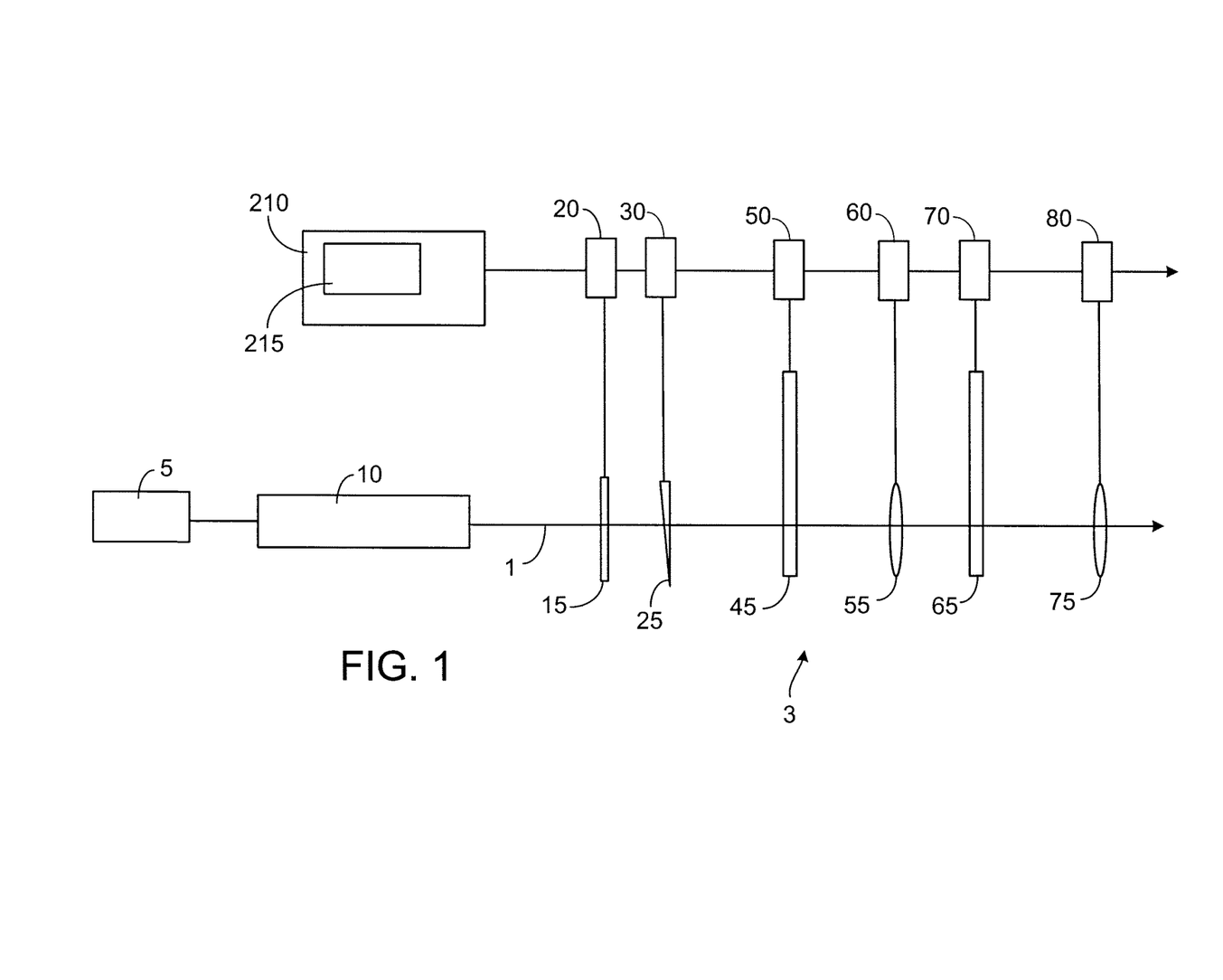
FIG. 1: shows a longitudinal section through a section of an illumination beam path of a mask inspection microscope according to the invention.

A mask inspection microscope according to a first exemplary embodiment comprises, as illustrated in FIG. 1, a light source 5, an excimer laser, which emits projection light having the wavelength of 193 nm. There follows along the optical axis 1 a homogenizer for homogenizing the intensity distribution of the projection light in the pupil plane and for depolarizing said light. There then follows a shutter 15, which can be introduced into or moved out of the illumination beam path 3 by means of the drive 20. It is composed of a radiation-opaque steel sheet. There then follows along the optical axis 1 an attenuator for varying the illumination intensity. Said attenuator can be moved into the illumination beam path 3 in a continuously variable manner by means of drive 30. The attenuator comprises a plate composed of quartz glass that is coated with chromium. The thickness of the chromium layer increases along the direction of movement. Thus, the radiation is attenuated to a greater extent, the greater the extent to which the attenuator is introduced in the illumination beam path 3. The attenuator 3 can also be provided with a dielectric layer, with the same effect.

There then follows the diaphragm plate 45, which is arranged in a pupil plane of the illumination beam path 3. The control is effected by means of drive 50, which enables the radius-determining diaphragms 47 to be positioned accurately.

Figure 4:
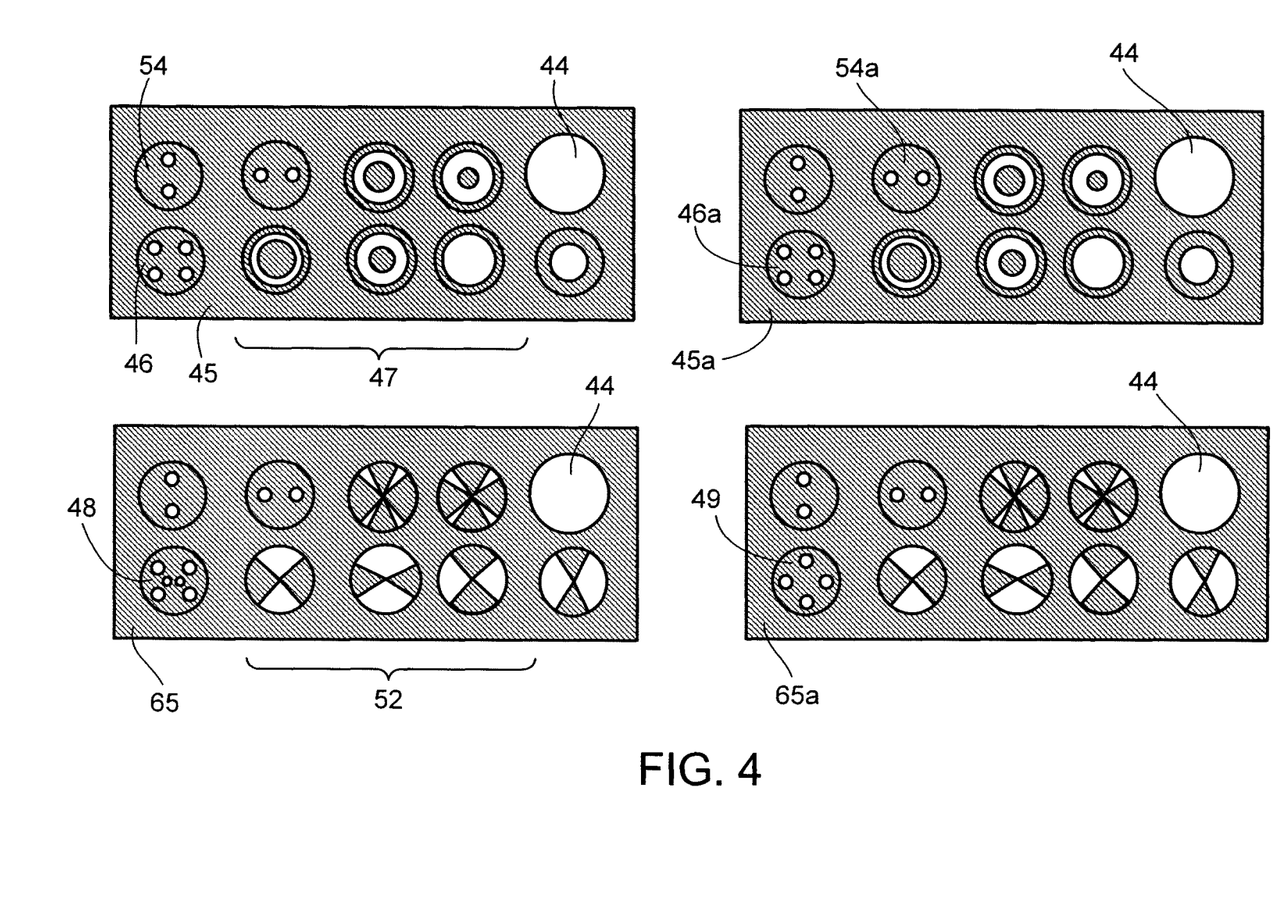
FIG. 4: shows a plane view of different diaphragm plates.

The set diaphragm of the radius-determining diaphragms is imaged onto the angle-determining diaphragms 52 of the further diaphragm plate 65 in the desired size by means of a zoom lens 55 with actuating drive 70, said further diaphragm plate likewise being arranged in a pupil plane of the illumination beam path 3. The imaging scale can be varied by a factor of 3. The diaphragm plates are illustrated in FIG. 4; the projection-light-opaque regions are illustrated in hatched fashion. The diaphragm plate 65 is moved laterally by drive 70 in order to introduce a desired diaphragm of the angle-determining diaphragms 67 into the illumination beam path 3. The diaphragm plates 45, 65 are exchangeably connected to the drives 50, 70, by means of quick-acting clamping devices 240. The quick-acting clamping device 240 is part of the drive 50.

Figure 5:
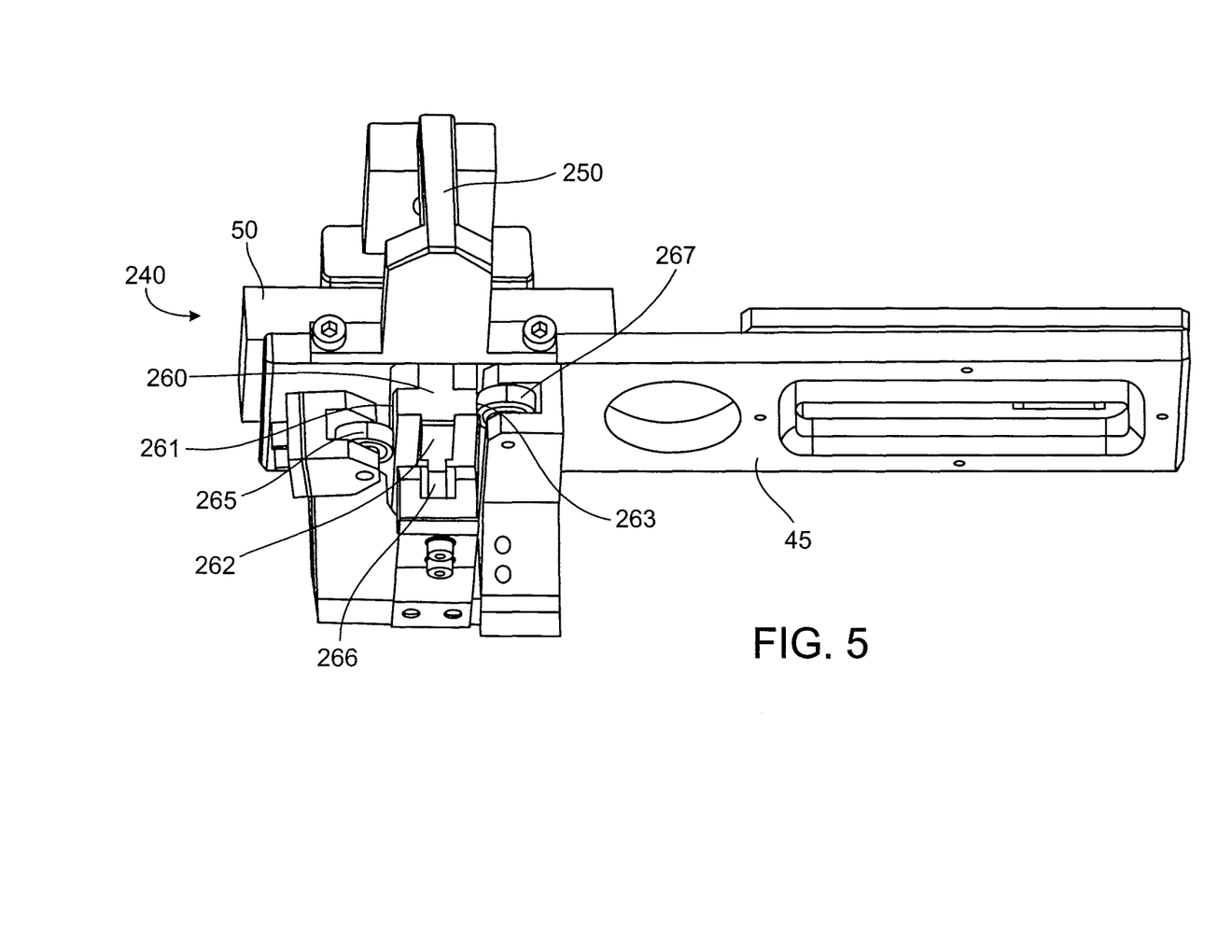
FIG. 5: shows a quick-acting clamping device for fixing a diaphragm plate.

Quick-acting clamping device 240 is described in detail on the basis of the example of the diaphragm plate 45 in FIG. 5. The individual diaphragms are not illustrated here. Diaphragm plate 45 is held by the user at a handle 250. The fixing web 260 is part of the diaphragm plate 45. Against the surfaces 261, 262 and 263 of said web, the rollers 265, 266 and 267, to which spring force is applied, press the diaphragm plate against the holder 270, which is connected to the motors (not described in greater detail). If the diaphragm plate has been completely fixed, the roller 266 latches into a depression (not illustrated) on the surface 262.

Figure 3:
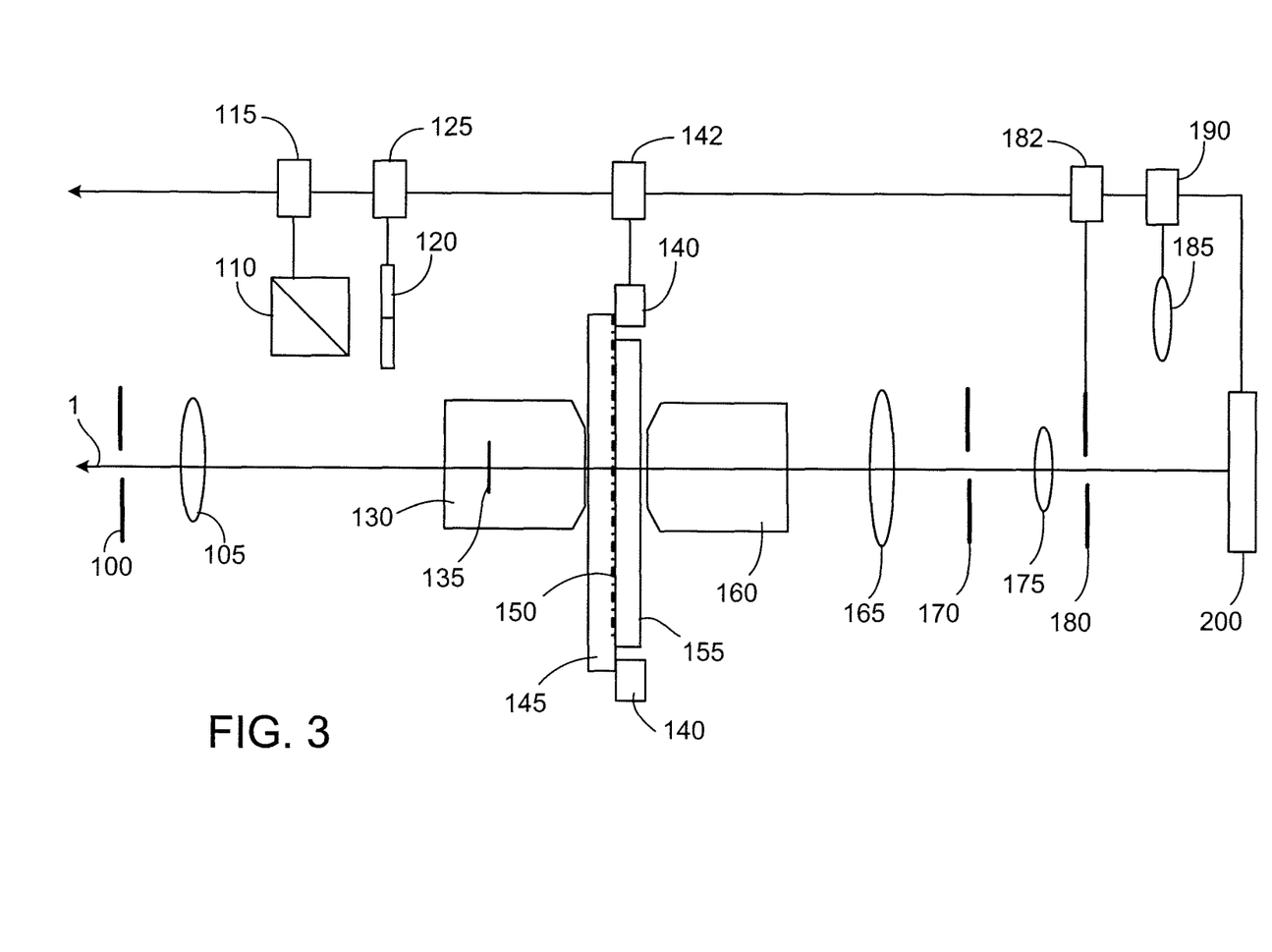
FIG. 3: shows a longitudinal section through a section of an illumination beam path and imaging beam path of a mask inspection microscope according to the invention.

By means of a further zoom lens 75 with drive 80, the pupil plane of the diaphragm plate 65 is finally imaged onto the resultant pupil plane 135 of the condenser 130, as illustrated in FIG. 3.

In further exemplary embodiments (not illustrated), one of the zoom lenses 55 or 75 or both is or are replaced by lenses having a fixed imaging scale.

Examples of a first diaphragm plate 45 and a further diaphragm plate 65 are shown in FIG. 4. Diaphragm plate 45 contains, inter alia, ring-shaped diaphragms 47, having rings of different widths in order to vary the inner and outer coherence or the ratio thereof in the illumination setting. The further diaphragm plate 65 contains, inter alia, angle-determining diaphragms 52. The latter comprise for example alternating light-transmissive and light-opaque sectors. By way of example, diaphragms having two light-opaque sectors lying opposite one another and two light-transmissive sectors lying opposite one another are provided for disars, and diaphragms each having four sectors are provided for quasars. The aperture angles of the sectors can vary.

Both diaphragm plates 45, 65 have a larger aperture 44 that no longer act as a diaphragm. It is advantageous if only one diaphragm of a diaphragm plate 45, 65 is intended to be utilized.

The continuation of the illumination beam path 3 of the first exemplary embodiment is illustrated in FIG. 3. There follows a field diaphragm 100 for determining the size of the illumination field on the reticle 145. Downstream of the field diaphragm 100 there follow a tube lens 105 and the condenser 130 with the pupil plane 135.

For polarizing the projection light, the polarizers 110 and 120 can be introduced into the illumination beam path 3 by the drives 115 and 125. Polarizer 110 linearly polarizes the projection light; the direction of the polarization can be set by rotation of the polarizer 110 by drive 115. In order to achieve tangential polarization of the illumination light, in addition to the polarizer 110 the polarizer 120, which is embodied as a segmented polarization converter, is introduced into the illumination beam path 3. The linear polarization is rotated sector by sector by said polarizer 120, such that approximately tangential polarization results. Three variants of the polarizer 120 are available (not illustrated in FIG. 3). It is possible to choose between the subdivisions into 4, 8 or 12 sectors.

The masks 145 having the structure 150 that is to be inspected is protected by a pellicle 155. The mask lies on the mask holder 140, which is moved laterally by drive 142 in order to move the mask to the desired position, such that the location to be inspected is situated in the illumination beam path 3. The image of the reticle is imaged by objective 160 via the tube lens 165, field diaphragm 170, magnification optical unit 175 onto the detector 200, a CCD chip (charge coupled device). The numerical aperture is set by the NA diaphragm 180 with drive 182.

For imaging the pupil plane of the illumination beam path 3 on the detector 200, a Bertrand lens 185 is introduced into the illumination beam path 3 by drive 190.

All the drives 20, 30, 50, 60, 70, 80, 115, 125, 142, 182, 190 and the detector 200 are connected to a data processing system 210 with input and output unit 215. The mask inspection microscope is controlled by said data processing system 210, and in addition the respective image is stored by the read-out of the detector 200, and the image data are processed further.

If a diaphragm of the diaphragm plates 45 or 65 is introduced into the illumination beam path by means of drive 50 or 70, it has to be centered with respect to the optical axis 1 of the illumination beam path 3. For this purpose, the image of the diaphragm is imaged via the Bertrand lens 185 on the detector 200. The relevant diaphragm plate is then moved laterally until the image of the diaphragm has obtained the desired position. Detector 200 is calibrated beforehand, that is to say that the position of the point of intersection of the optical axis with the surface of the detector is known.

A mask inspection microscope that operates in transmission was described in the first exemplary embodiment. In a further exemplary embodiment, which is not illustrated in the drawings, the mask inspection microscope operates in reflection. Here, the reticle 145 is illuminated from the side of the structure 150. The reticle therefore lies precisely with the opposite side on the mask holder 140. The light reflected at the structure 150 is coupled out from the illumination beam path 3 by a beam splitter in a known manner and proceeds further, as illustrated in FIG. 3, as far as the imaging on a detector 200.

Figure 2:
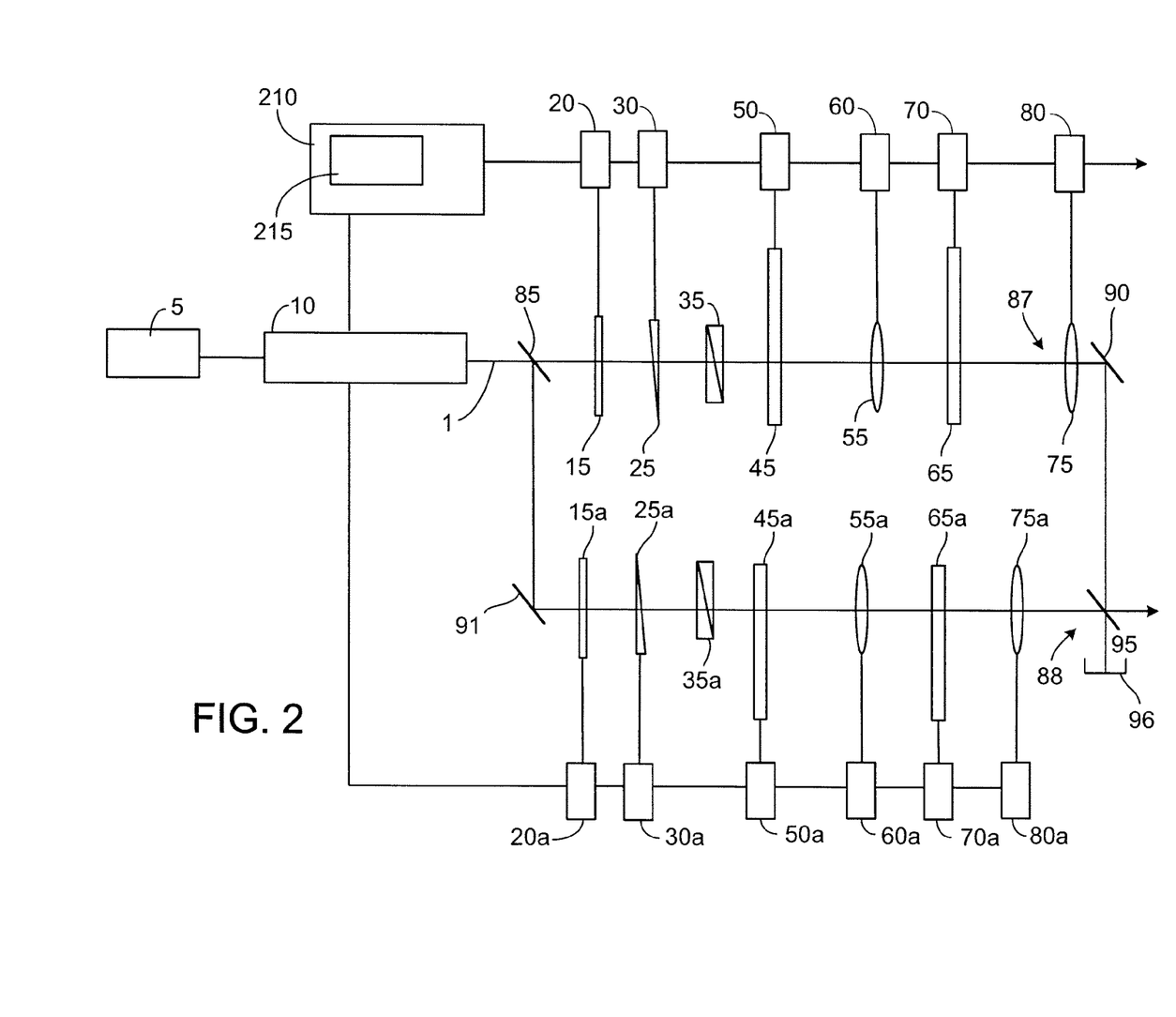
FIG. 2: shows a longitudinal section through a section of two illumination beam paths of a mask inspection microscope according to the invention.

In a second configuration of the invention, the illumination beam path 3 is split into a first illumination beam path 87 and a second illumination beam path 88 by means of a polarization-independent beam splitter 85, as illustrated in FIG. 2. The illumination beam paths 87 and 88 are recombined to form illumination beam path 3 by means of a further polarization-independent beam splitter 95. The mirrors 90 and 91 direct the projection light in the necessary directions. Beam blocker 96 absorbs the non-utilizable proportion of the projection light from beam splitter 95.

The first illumination beam path 87 is constructed analogously to the illumination beam path 3 of the first exemplary embodiment. Identical elements in the corresponding sections bear identical reference symbols. It comprises shutter 15, attenuator 25, first diaphragm plate 45, zoom lens 55, further diaphragm plate 65 and zoom lens 75. In addition, a deflection mirror 90 is arranged in such a way that the projection light is directed onto the polarization-independent beam splitter 95.

The second illumination beam path 88 is also constructed analogously to the illumination beam path 3 of the first exemplary embodiment. Identical elements in the corresponding sections bear identical reference symbols supplemented by "a". It comprises shutter 15a, attenuator 25a, first diaphragm plate 45a, zoom lens 55a, further diaphragm plate 65a and zoom lens 75a and the respective drives 20a, 30a, 50a, 60a 70a, 80a.

As described in the first exemplary embodiment, the zoom lenses can be replaced by lenses having a fixed imaging scale.

A λ/2 plate 35/35a is introduced as required into each of the two illumination beam paths 87, 88 in the region between the polarization-independent beam splitters 85 and 95, in order to eliminate undesired polarizations of the projection light which arise as a result of reflection of the projection light at the beam splitters 85 and 95.

In a further exemplary embodiment, X/Y-polarizing beam splitters 85 and 95 are used in a targeted manner, and the λ/2 plates 35/35a are then obviated. Thus, the beam splitter 85 provides X-polarized light in the illumination beam path 87 and Y-polarized light in the illumination beam path 88 (or vice versa). The illumination beam paths are then recombined in a manner virtually free of losses by the correspondingly oriented X/Y-polarizing beam splitter 95 and the respective polarizations are maintained. The beam blocker 96 is obviated here.

The further course of the illumination beam path 3 is, as illustrated in FIG. 3, identical to that described in the first exemplary embodiment.

As in the first exemplary embodiment, all the drives 20, 30, 50, 60, 70, 80, 20a, 30a, 50a, 60a, 70a, 80a, 115, 125, 142, 182, 190 and the detector 200 are connected to a data processing system 210 with input and output unit 215.

In a further exemplary embodiment (not illustrated), two polarizers 110 and 120 for linear and respectively tangential polarization of the projection light with the drives 115 and 125 are arranged in each illumination beam path 87, 88. Beam splitter 95 is then arranged downstream of said polarizers 110, 120 in order to combine the illumination beam paths 87, 88.

All the diaphragm plates 45, 45a, 65, 65a have a larger aperture 44 that no longer acts as a diaphragm. It is advantageous if the corresponding diaphragm plate is not intended to be utilized, since it does not have to be demounted. Thus, provision is made of specific diaphragms for illumination settings, e.g. 48, 49, which can be assembled from a plurality of diaphragms only in an elaborate manner.

The diaphragm plates 45, 65 of the first illumination beam path 87 can be identical to those of the first exemplary embodiment. The illumination settings thus obtained can then be altered further by the diaphragms of the diaphragm plates 45a, 65a of the second illumination beam path 88.

If disars rotated about the optical axis 1 by 90° with respect to one another are set in the two illumination beam paths 87, 88, as described in the first exemplary embodiment, then the resultant intensity distribution of the pupil plane is a quasar. A quadrupole can also be set by means of the dipoles 54 and 54a rotated about the optical axis 1 by 90° with respect to one another on the parallel diaphragm plates 45 and 45a. The intensities of the opposite poles of the quasar or quadripole can then be set by the attenuators 25, 25a.

If a quasar is set in the first illumination beam path 87, as described in the first exemplary embodiment, then the central region can additionally be illuminated circularly e.g. by means of the second illumination beam path 88.

The gradient of the resultant intensity distribution of the pupil plane can be decreased if the same form of illumination setting as in the first illumination beam path 87, but with a different extent, is set in the second illumination beam path 88. For this purpose, diaphragms with corresponding different extents are provided on the diaphragm plates 45 and 45a and respectively 65 and 65a that are used in parallel. Thus, by way of example, two quadrupoles 46, 46a are provided on the diaphragm plates 45 and 45a. The position of the midpoints of the poles is identical; the diameter of the poles differs slightly. The resultant intensity distribution leads to a higher intensity in the region of the superposition of the two diaphragms than in the edge region of the poles, which is covered only by one diaphragm. The intensity distribution of the superposed quadrupoles can be varied by the attenuators 25, 25a.

The illumination beam paths 87, 88 can also be completely masked out by the shutters 15, 15a.

It is the case also for adjusting the diaphragms from one of the illumination beam paths 87, 88 that the respective other path can be masked out by one of the shutters 15, 15a.

In a further exemplary embodiment, which is not illustrated in the drawings, two diaphragm plates (45, 65) are arranged in a pupil plane. The diaphragm plates are moveable with respect to one another and can thus be moved by a drive both perpendicularly to the illumination beam path and with respect to one another. Consequently, the individual diaphragms arranged on the diaphragm plates (45, 65) can be introduced into the illumination beam path in any desired combinations by means of corresponding drives. The configuration of the diaphragm plates (45, 65) and the combination possibilities therefor correspond to those of the first exemplary embodiment.

When a diaphragm plate is inserted into the mask inspection microscope, the position of the diaphragm plate 45, 45a, 65, 65a within the illumination beam path 3, 87, 88 is stored in the data processing system 210. For each of the diaphragm plates 45 and 45a and respectively 65 and 65a, the data processing system 210 reads in a respective data record having information about position and properties of the diaphragms of said diaphragm plate 45, 45a, 65, 65a.

The position of a diaphragm is defined by specifying the coordinates of the midpoints of the individual diaphragms proceding from a reference point on the diaphragm plate 45, 65, 45a, 65a. The outer and inner degrees of coherence or the aperture angles or positions and diameters of poles of the diaphragms are additionally specified. The complete form and a graphical representation of each diaphragm is also given.

By means of the data processing system 210, diaphragms of a diaphragm plate 45, 45a, 65, 65a can be selected in a targeted manner and can be introduced into the illumination beam path 3, 87, 88 by movement of the respective diaphragm plate 45, 65, 45a. Any desired diaphragm combinations can be selected and set in this way. The imaging scales of the zoom lenses 55, 75 and, if appropriate, 55a and 75a, and also the positions of the polarizers 110 and 120 and attenuators 25, 25a are also set by means of the data processing system 210.

The illumination settings resulting from the combination of the different diaphragms are then determined by the data processing system 210. The fact of whether the diaphragm plates 45, 65, 45a are combined sequentially or in parallel is determined by the positions predetermined upon insertion of the diaphragm plates in the mask inspection microscope. The resultant intensity distributions are represented graphically and the abovementioned parameters for their characterization, such as e.g. inner and outer coherence, are specified. The contributions of the individual diaphragms are represented in different colors. The possible imaging scales can be predetermined by the user by means of the zoom lenses 55, 75 and, if appropriate, 55a and 75a. The combinations given maximum and minimum setting of the imaging scales are then represented or fixed imaging scales can be predetermined by the user.

The user can then select one of the possible illumination settings via the input and output unit 215. In addition, the user inputs the desired settings of the polarizers and attenuators via the input and output unit 215. The shutters 15, 15a, attenuators 25, 25a, diaphragm plates 45, 65, 45a and polarizers 110, 120 are then set by the data processing system 215 via the drives 20, 30, 50, 70, 80, 20a, 30a, 50a, 70a, 80a, 115 in such a way that the desired illumination setting results.

What is claimed is:

1. A mask inspection microscope for generating an image of the structure of a reticle arranged in an object plane in a field plane of the mask inspection microscope, comprising:
    a light source that emits projection light,
    at least one illumination beam path, and
    a first diaphragm and at least one further diaphragm for generating a resultant intensity distribution of the projection light in a pupil plane of the illumination beam path,
    wherein the at least one further diaphragm is positioned downstream of the first diaphragm and upstream of the reticle in the illumination beam path, the first diaphragm and the at least one further diaphragm influencing the resultant intensity distribution of the projection light at least partly at different locations of the pupil plane.

2. The mask inspection microscope as claimed in claim 1, wherein at least two diaphragms used as first diaphragm or as further diaphragm are arranged on a diaphragm plate, such that the individual diaphragms are changed by the movement of the diaphragm plate.

3. The mask inspection microscope as claimed in claim 2, wherein the diaphragm plate is connected to a drive by a quick-acting clamping device.

4. The mask inspection microscope as claimed in claim 1, wherein a data record having information about positions of the diaphragms on the diaphragm plate is present with respect to each diaphragm plate.

5. The mask inspection microscope as claimed in claim 4, wherein a data record having information about properties of the diaphragms is present with respect to each diaphragm plate.

6. The mask inspection microscope as claimed in claim 1, wherein a data processing system is provided, which determines possible illumination settings with respect to predetermined diaphragm plates.

7. The mask inspection microscope as claimed in claim 1, wherein at least one polarizer is arranged in the illumination beam path.

8. The mask inspection microscope as claimed in claim 1, wherein at least one of the polarizers linearly polarizes the projection light.

9. The mask inspection microscope as claimed in claim 1, wherein at least one of the polarizers polarizes the linearly polarized projection light at least in sections tangentially with respect to the optical axis of the illumination beam path.

10. The mask inspection microscope as claimed in claim 1, wherein at least two diaphragms are arranged along an illumination beam path.

11. The mask inspection microscope as claimed in claim 10, wherein at least two diaphragms are arranged in different pupil planes.

12. The mask inspection microscope as claimed in claim 10, wherein at least two diaphragms are arranged jointly in one of the pupil planes.

13. The mask inspection microscope as claimed in claim 10, wherein at least one first set of the diaphragms is configured in such a way that the radius-dependent intensity distribution of the projection light and at least one second set of the diaphragms is configured in such a way that the angle-dependent intensity distribution of the projection light is determined in the pupil planes that is optically conjugate with respect to the object plane.

14. The mask inspection microscope as claimed in claim 1, wherein the at least one illumination beam path, for splitting the projection light, is split at least in sections into at least two illumination beam paths and at least one diaphragm is arranged in each of the illumination beam paths.

15. The mask inspection microscope as claimed in claim 14, wherein the illumination beam paths are recombined upstream of the object plane.

16. The mask inspection microscope as claimed in claim 14, wherein polarization converters for the elimination of undesired polarization of the projection light are arranged in at least one of the illumination beam paths.

17. The mask inspection microscope as claimed in claim 14, wherein at least two of the diaphragms influence the intensity distribution of the pupil plane at different locations.

18. The mask inspection microscope as claimed in claim 14, wherein at least one polarizer is arranged in each of the illumination beam paths.

19. The mask inspection microscope as claimed in claim 14, wherein the projection light is split between the illumination beam paths to the extent of identical portions in each case.

20. The mask inspection microscope as claimed in claim 14, wherein an attenuator is arranged in at least one of the illumination beam paths.

21. The mask inspection microscope as claimed in claim 14, wherein a shutter is arranged in at least one of the illumination beam paths.

22. The mask inspection microscope as claimed in claim 1, wherein at least one zoom lens is arranged in the at least one illumination beam path, a pupil plane of the at least one illumination beam path being imaged in variable size onto at least one further pupil plane of the illumination beam path by means of said at least one zoom lens.

* * * * *

UNITED STATES PATENT AND TRADEMARK OFFICE
CERTIFICATE OF CORRECTION

| | | |
|---|---|---|
| PATENT NO. | : 9,116,447 B2 | Page 1 of 1 |
| APPLICATION NO. | : 13/063294 | |
| DATED | : August 25, 2015 | |
| INVENTOR(S) | : Stroessner | |

It is certified that error appears in the above-identified patent and that said Letters Patent is hereby corrected as shown below:

<u>On the Title Page</u>

Item 60, delete "60/101,732" and insert -- 61/101,732 --

<u>In the Specification</u>

<u>Column 5</u>

Line 54, delete "diagraphms" and insert -- diaphragms --

<u>Column 9</u>

Line 4, after "diaphragms" insert -- 47 --

<u>Column 10</u>

Line 56, delete "constructured" and insert -- constructed --

<u>Column 11</u>

Line 3, delete "65aand" and insert -- 65a and --

Line 4, delete "75aand" and insert -- 75a and --

Line 5, delete "60a70a," and insert -- 60a, 70a, --

<u>Column 12</u>

Line 40, delete "proceding" and insert -- proceeding --

Signed and Sealed this
Twelfth Day of January, 2016

Michelle K. Lee
*Director of the United States Patent and Trademark Office*